United States Patent [19]

Steinberg

[11] Patent Number: 4,752,531

[45] Date of Patent: * Jun. 21, 1988

[54] DIELECTRIC COMPOSITION

[75] Inventor: Jerry I. Steinberg, Wilmington, Del.

[73] Assignee: E. I. Du Pont de Nemours and Company, Wilmington, Del.

[*] Notice: The portion of the term of this patent subsequent to Mar. 31, 2004 has been disclaimed.

[21] Appl. No.: 930,465

[22] Filed: Nov. 14, 1986

Related U.S. Application Data

[62] Division of Ser. No. 715,971, Mar. 25, 1985, Pat. No. 4,654,095.

[51] Int. Cl.$^4$ .......................... B32B 18/00; C03C 8/24
[52] U.S. Cl. .................................... 428/426; 428/432; 428/688; 501/15; 501/20; 501/62; 501/102; 501/133; 156/89

[58] Field of Search ............... 156/89, 242, 246; 501/15, 17, 20, 22, 61, 62, 73, 76, 102, 103, 128, 133; 428/426, 432, 688

[56] References Cited

U.S. PATENT DOCUMENTS 4,642,148  2/1987  Kurihara et al. .................. 428/210
4,655,864  4/1987  Rellick .................................. 156/89

*Primary Examiner*—John E. Kittle
*Assistant Examiner*—Beth A. Bozzelli

[57] ABSTRACT

A dielectric composition comprising an admixture of finely divided solids comprising (a) a noncrystallizable glass of which the deformation temperature ($T_d$) is 580°–625° C. and the softening point ($T_s$) is 630°–700° C., and ($T_s$–$T_d$) is 50°–75° C., and (b) a refractory which is substantially insoluble in the glass at temperatures of 825°–900° C.

3 Claims, No Drawings

DIELECTRIC COMPOSITION

This is a division of application Ser. No. 715,971 filed Mar. 25, 1985, this Serial Number is now U.S. Pat. No. 4,654,095.

FIELD OF INVENTION

The invention relates to dielectric compositions, especially those which are useful in forming multilayer circuits.

BACKGROUND OF THE INVENTION

Multilayer thick film circuits have been used for many years to increase circuit functionality per unit of area. Moreover, recent advances in circuit technology have placed new demands on dielectric materials for this use. Heretofore, most of the dielectric materials used in multiple circuits have been conventional thick film dielectric compositions. These are comprised of finely divided particles of dielectric solids and inorganic binders dispersed in an inert organic medium. Such thick film materials are usually applied by screen printing, though they may be applied by other means as well. Thick film materials of this type are very important and will continue to be so.

In constructing a multilayer circuit using thick film materials, it is necessary sequentially to print, dry and fire each functional layer before the next layer is applied. Thus, in a typical situation involving multicircuits having, say, twenty layers, sixty separate processing steps are required as well as twenty inspections to assure the quality of each of the processed layers. Such a complex process is, of course, expensive both because of the great number of steps and because of the high yield losses which are normally incident to such a complex procedure.

Another approach to this problem has been the use of dielectric tapes in which a large number of thin sheets of ceramic dielectric material, such as $Al_2O_3$, are laid down interspersed with alternating printed layers of conductive materials. However, because of the very high temperature, on the order of 1600° C., required to sinter $Al_2O_3$, it is necessary to use very high melting conductive materials such as molybdenum and tungsten. Unfortunately, molybdenum and tungsten have poor conductivity properties which make them less satisfactory for very high speed, highly complex circuitry. Moreover, multilayer circuits made with these materials must be fired in a reducing atmosphere at 1600° C. for quite long periods of time, which may approach 48 hours or more, to obtain adequate densification of the $Al_2O_3$.

From the foregoing, it can be seen that there is a great need for a dielectric system which (1) does not involve so many processing steps, (2) can be fired at lower temperatures, thus permitting the use of conventional conductive materials such as gold, silver, and palladium, (3) can be densified by firing only a few hours, and (4) can be fired in air.

BRIEF DESCRIPTION OF THE INVENTION

In view of the foregoing shortcomings of the prior art, the invention is directed in its primary aspect to a dielectric composition comprising an admixture of finely divided solids comprising:

a. 50-75% wt. noncrystallizable glass of which the deformation temperature ($T_d$) is 580°–625° C. and the softening point ($T_s$) is 630°–700° C., and ($T_s$–$T_d$) is 50°–75° C., and b. 50-25% wt. refractory which is substantially insoluble in the glass at temperatures of 825°–900° C.

In a second aspect, the invention is directed to a tape casting composition comprising the above described dielectric composition dispersed in a solution of binder polymer in a volatile nonaqueous solvent.

In a third aspect, the invention is directed to a method of forming green tape by casting a thin layer of the above described dispersion onto a flexible substrate, such as a steel belt or polymeric film, and heating the cast layer to remove the volatile solvent therefrom.

In a fourth aspect, the invention is directed to a method of forming multilayer interconnections comprising the steps of:

a. forming a patterned array of vias in a plurality of layers of green tape made by the above-described process;

b. filling the vias in the green tape layer(s) of step a. with thick film conductor composition;

c. printing at least one patterned thick film functional layer over a surface of each of the via-filled green tape layers of step b.;

d. laminating the printed green tape layers of step c. to form an assemblage comprising a plurality of unfired interconnected functional layers separated by unfired green tape; and e. cofiring the assemblage of step d.

Prior Art

It is well known to employ "green tapes" in the fabrication of multilayer circuits. Such green tapes are made by casting a dispersion of the dielectric material in a solution of polymeric binder in volatile organic solvent onto a flexible substrate, such as a steel belt or polymeric film, and then heating the cast layer to remove the volatile solvent therefrom. Such green tapes and their applications are disclosed in many patents, for example, the following:

U.S. Pat. No. 3,540,894 to McIntosh discloses a ceramic casting composition containing a low melting lead borosilicate, clay and a crystalline phase which is $Al_2O_3$, $ZnZrSiO_5$ or $CaSiO_3$.

Hurley et al. in U.S. Pat. No. 3,717,487 disclose a ceramic slip concentrate comprising inter alia $Al_2O_3$ dispersed in a slip containing a polymethacrylate binder, solvent and a dispersing agent.

U.S. Pat. No. 3,832,192 to McIntosh discloses dielectric green sheets containing a lead borosilicate glass and a crystalline material containing a spinel phase.

In U.S. Pat. No. 3,857,923, Gardner et al. disclose a ceramic green tape comprising mullite dispersed in a binder such as poly(vinyl butyral).

Schmank in U.S. Pat. No. 3,962,162 discloses a casting solution for making green ceramic sheet comprising refractory powder such as $Al_2O_3$ dispersed in a solution of polyester, crosslinking monomer, free radical initiator and mold release compound.

U.S. Pat. No. 3,988,405, to Smith et al. discloses a casting composition comprising a ceramic material, especially a glass ceramic, dispersed in an acrylic copolymer latex in which one of the comonomers is a polymerizable carboxylic acid.

U.S. Pat. Nos. 4,080,414 and 4,104,345 to Anderson et al. are directed to ceramic green sheets prepared from a casting solution containing both a solvent and nonsolvent for the organic binder.

Swiss et al. in U.S. Pat. No. 4,153,491 disclose a green ceramic sheet material comprising a high Al₂O₃ glass frit composition dispersed in a binder of organic material.

U.S. Pat. No. 4,272,500 to Eggerding et al., is directed to a ceramic green tape comprising a mixture of mullite and Al₂O₃ dispersed in a polyvinyl butyral binder.

U.S. Pat. No. 4,183,991 to Smiley et al. discloses a casting mixture comprising a dispersion of inert filler particles in a solution of polymer-in-monomer for preparing filled polymer sheets as thin as 0.1 inch (0.25 cm).

U.S. Pat. No. 4,301,324 to Kumar et al. is directed to a ceramic green tape in which the ceramic material is either β-spodumene or cordierite.

DETAILED DESCRIPTION OF THE INVENTION

Glass

The composition of the glass for use in the compositions of the invention is not critical by itself. It is critical only from the standpoint that it results in a glass which is noncrystallizable under the conditions of use and which has the following additional properties:

| Deformation Temperature ($T_d$) | 580–625° C. |
| Softening Point ($T_s$) | 630–700° C. |
| $T_s$-$T_d$ | 50–75° C. |

It has been found that glasses having the above combination of physical properties when fired at 825°–900° C. enable quite good burnout of the organics and have an appropriate viscosity at the firing temperature so that the formulation sinters to a very high density, i.e., above 93% theoretical density, thus giving a desirably nonporous layer which prevents electrical shorting of the conductive electrode layer materials with which the composition is fired.

It is, however, essential that the difference between the deformation temperature and softening point of the glass be within the range of 50°–75° C. If this difference is above 75° C., there is too little flow of the glass at 825°–900° C. and if the difference is less than 50° C., there is so much glass flow that migration into the electrode material becomes a problem. (Deformation temperature and softening point are measured with a dilatometer.) Correlation of these two variables defines the viscosity-temperature characteristic of the glass which may be used in the invention.

Further it is essential that the glass be noncrystallizable under the conditions of use and that it have no significant solubilizing effect on the refractory component of the composition. This is necessary in order to have precise control over the viscosity-temperature characteristics of the glass and thus the rheology of the entire composition during firing. In particular, it is preferred that the refractory be no more than about 5% wt. soluble in the glass and preferably no more than 3% wt. soluble when fired between 825°–900° C. for times up to 30 minutes.

Likewise, the amount of glass relative to the amount of refractory material is quite important in that if the glass concentration exceeds 75% by wt., basis glass and refractory, the result fired layer tends to have an irregular surface, the multilayer structure tends to become too brittle, solderability of the surface is degraded and the properties of the associated conductive layers also tend to be degraded. On the other hand, if the amount of glass is less than 50% by wt., the fired structure is not sufficiently densified and is too porous. In addition, the fired structure may lose planarity (flatness). In consideration of these variables, it is preferred that the composition contain 55–70% wt. glass and preferably still 61–67% wt. glass. Within these limits for the concentration of glass and the complemental amount of refractory in the composition and the solubility of the refractory in the glass, it will be apparent that, during firing, the liquid glass will become saturated with refractory material.

Refractory

The refractory component of the invention is chosen, as described above, so that it has only minimal, if any, solubility in whatever glass is used therewith. Within this criterion, the refractory is also chosen on the basis of its temperature coefficient of expansion (TCE). Thus, α-quartz, Al₂O₃, CaZrO₃, or forsterite are chosen if it is desired to have a relatively high TCE. On the other hand, if a relatively low TCE is desired, the refractory will be chosen from mullite, cordierite, and zirconia. Mixtures of any of these are, of course, suitable for the purpose of adjusting the TCE to various intermediate values.

Another function of the refractory is rheological control of the entire system during firing. The refractory particles limit flow of the glass by acting as a physical barrier. They also inhibit sintering of the glass and thus facilitate better burnout of the organics.

For the purpose of obtaining higher densification of the composition upon firing, it is important that the inorganic solids have quite small particle sizes. In particular, substantially none of the particles should exceed 15 μm and preferably they should not exceed 10 μm. Subject to these maximum size limitations, it is preferred that the 50% point of the particles, both glass and refractory, be no less than 1 μm and preferably the 50% point should lie in the 2–5 μm range.

Polymeric Binder

The organic medium in which the glass and refractory inorganic solids are dispersed is comprised of the polymeric binder which is dissolved in a volatile organic solvent and, optionally, other dissolved materials such as plasticizers, release agents, dispersing agents, stripping agents, antifouling agents and wetting agents.

To obtain better binding efficiency, it is preferred to use at least 5% wt. polymer binder for 90% vol. ceramic solids. However, it is further preferred to use no more than 20% wt. polymer binder in 80% wt. ceramic solids. Within these limits, it is desirable to use the least possible amount of binder vis-à-vis solids in order to reduce the amount of organics which must be removed by pyrolysis and to obtain better particle packing which gives reduced shrinkage upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

More recently, Usala, in U.S. patent application Ser. No. 501,978, filed June 7, 1983, has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the polymers permit the use of minimum amounts of binder and maximum amounts of dielectric solids, their use is preferred with the dielectric composition of this invention. For this reason, the disclosure of the above referred Usala application is incorporated by reference herein.

Frequently, the polymeric binder will also contain a small amount, relative to the binder polymer, of a plasticizer which serves to lower the glass transition temperature (Tg) of the binder polymer. The choice of plasticizers is, of course, determined primarily by the polymer which must be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequency used in acrylic polymer systems because it can be used effectively in relatively small concentrations.

Organic Solvent

The solvent component of the casting solution is chosen so as to obtain complete solution of the polymer and sufficiently high volatility to enable the solvent to be evaporated from the dispersion by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, 1,1,1-trichloroethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

A particularly preferred solvent is comprised of 1,1,1-trichloroethane containing no more than 10% by weight each of isopropanol, methyl ethyl ketone, methylene chloride and fluorocarbons such as trichlorofluoromethane and trichlorotrifluoroethane.

It is preferred that the above described solvent blend contain 3–7% by wt. methylene chloride which has been found to prevent cracking and crazing of the polymeric binder during tape preparation. It is also preferred that the solvent contain 3–6% wt. isopropanol which has been found to be effective in reducing the viscosity of the casting slurry. Similarly, it is desirable to have 4–8% by wt. methyl ethyl ketone in the blend because of its excellent polymer solvency and somewhat lower volatility. In addition, it is preferred that the solvent contain 6.5–9.3% wt. volatile fluorocarbons in order to raise the flash point of the solvent blend for safety reasons. Though at least 6.5% wt. fluorocarbon is needed to obtain suitable shifting of the flash point (ASTM Tag Closed Cup), no more than 9.0% wt. should be used lest it affect the polymer solvency of the solvent blend. A particularly preferred solvent blend contains the following range of components:

| 1,1,1-trichloroethane | 70–83.5% wt. |
|---|---|
| Methylene Chloride | 7–3 |
| Methyl Ethyl Ketone | 9–4 |
| Isopropanol | 6–3 |
| Fluorocarbon | 9.3–6.5 |

Application

The green tape is used primarily as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize the green tape. Typical via hole sizes range from 0.006" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, especially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace.

As used herein, the term "firing" means heating the assemblage in an oxidizing atmosphere such as air to a temperature and for a time sufficient to volatilize (burn-out) all of the organic material in the layers of the assemblage to sinter any glass, metal or dielectric material in the layers and thus densify the dielectric layer.

It will be recognized by those skilled in the art that in each of the laminating steps the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, as indicated above, a typical green tape layer may have printed thereon one or more resistor circuits and/or capacitors as well as a conductive circuit.

EXAMPLES

Example 1

A casting solution was formulated by dispersing the below listed inorganic solids in a solvent blend contained in a ball mill. The dispersion was achieved by milling for 14 hours using 0.25 in. alumina balls as a grinding medium. Viscosity of the casting solution was 2900 cps as measured on a Brookfield RVT viscometer using Spindle No. 5 at 20 rpm. This solution was formed into a green tape by casting onto a silicone-coated Mylar ®[1] polyester film. The solvent was substantially completely removed by heating the cast film at 140° F. (60° C.). The thickness of the solvent-free tape was 4.0±0.2 mils. The composition of the casting solution and the glass component thereof are given below:

[1] Tradename of E. I. duPont de Nemours and Company, Wilmington, DE. for polyester film.

| Noncrystallizing Glass | | Casting Solution | |
|---|---|---|---|
| Composition | % Wt. | Composition, | % Wt. |
| PbO | 17.2 | Glass | 33.5 |
| $B_2O_3$ | 4.5 | $Al_2O_3$ | 17.1 |
| $SiO_2$ | 56.5 | $SiO_2$ | 4.2 |
| $Al_2O_3$ | 9.1 | Acrylic Polymer | 3.6 |
| CaO | 8.6 | MEK | 2.4 |
| $Na_2O$ | 2.4 | 1,1,1-Trichloro ethane | 30.2 |
| $K_2O$ | 1.7 | Dioctyl Phthalate | 1.9 |
| | | Isopropanol | 1.8 |
| | | Methylene Chloride | 2.1 |
| | | Freon ® TF[2] | 3.2 |
| Properties | | | |
| TCE | | 6.2 ppm/°C. | |
| $T_d$ | | 590° C. | |
| $T_s$ | | 660° C. | |
| Density | | 2.8 g/cm³ | |

[2] Tradename of E. I. du Pont de Nemours and Company, Wilmington, DE for trichlorotrifluoroethane.

The above described cast film was cut into several 3″×3″ sheets (7.6 cm×7.6 cm). Several sets of eight sheets were laminated together at 3,000 psi at 70° C. by means of a confined pressing die, measured and each laminant was weighed. Each of the laminants was fired for 60 minutes at 350° C. to effect organics removal and then fired at a peak temperature of 850° C. for 15 minutes in air during a heating and cooling cycle of 90 minutes. Upon measuring the fired laminants, it was found that average shrinkage in the x,y plane of the laminant was only 11.9%. The camber of the fired part was less than ±2 mils (0.051 mm) over its entire dimension. The TCE was 7.9 ppm/°C. between 25° C. and 300° C. The fired density was 2.9 g/cm³ which is 97% of theoretical. Thus, the dimensional stability of the fired tape was excellent. The dielectric constant was 8.0 at 1 KHz.

EXAMPLE 2

Using the same procedures as Example 1, a green tape was made and used to prepare an eight-layer laminant. The composition of the casting solution and the glass component thereof are given below:

| Noncrystallizing Glass | | Casting Solution | |
|---|---|---|---|
| Composition, | % Wt. | Composition, | % Wt. |
| PbO | 47.0 | Glass | 31.8 |
| $SiO_2$ | 35.6 | $Al_2O_3$ | 21.2 |
| $Al_2O_3$ | 7.6 | Acrylic Polymer | 4.8 |
| $SnO_2$ | 9.8 | MEK | 3.1 |
| | | 1,1,1-Trichloro ethane | 33.8 |
| | | Dioctyl Phthalate | 1.8 |
| | | Isopropanol | 2.4 |
| | | Methylene Chloride | 2.8 |
| | | Freon ® TF | 4.2 |
| Properties | | | |
| TCE | | 4.9 ppm/°C. | |
| $T_d$ | | 600° C. | |
| $T_s$ | | 665° C. | |
| Density | | 3.4 g/cm³ | |

The camber of the fired parts was less than ±2 mils (0.051 mm) over its entire dimension. The TCE was 5.6 ppm/°C. between 25° C. and 300° C. and the fired density was 94% of theoretical. Thus, the laminated parts had excellent dimensional stability, especially flatness.

EXAMPLE 3

Using the same procedures as Example 1, a green tape was made and used to prepare an eight-layer laminant. The composition of the glass was the same as in Example 1 and the casting solution had the following composition:

| Casting Solution Composition, | % Wt. |
|---|---|
| Glass | 33.9 |
| Mullite | 19.1 |
| Acrylic Polymer | 4.8 |
| MEK | 3.1 |
| 1,1,1-Trichloroethane | 33.8 |
| Dioctyl Phthalate | 1.8 |
| Isopropanol | 2.4 |
| Methylene Chloride | 2.8 |
| Freon ® TF | 4.2 |

The camber of the fired parts was only ±1 mil (0.0254 mm) over its entire dimension. The TCE was 5.5 ppm/°C. between 25° C. and 300° C. and the fired density was 2.8 g/cm³ which is 96% of theoretical. The fired part had a shrinkage in the x-y plane of 12.5%. Again, the data show excellent dimensional stability, especially the low camber, of the fired parts made from the compositions of the invention. The dielectric constant was 6.5 at 1 KHz.

EXAMPLE 4

A further green tape was made in which the glass did not meet the criteria of the invention and used to prepare an eight-layer laminant. The composition of the casting was the same as Example 2 except that the glass had the following composition and properties:

| Noncrystallizing Glass Composition, | % Wt. |
|---|---|
| PbO | 8.0 |
| $B_2O_3$ | 5.9 |
| $SiO_2$ | 40.2 |
| $Al_2O_3$ | 9.9 |
| CaO | 5.1 |
| BaO | 17.9 |
| ZnO | 8.0 |
| MgO | 5.0 |
| Properties | |
| TCE | 6.1 ppm/°C. |
| $T_d$ | 635° C. |
| $T_s$ | 715° C. |
| Density | 2.7 g/cm³ |

The laminated parts were all severely bowed into a parabolic shape.

What is claimed is:

1. A castable dielectric composition comprising a dispersion of finely divided solids comprising:
   a. 50-75% wt. noncrystallizable glass of which the deformation temperature ($T_d$) is 580°-625° C. and the softening point ($T_s$) is 630°–700° C., and ($T_s$–$T_d$) is 50°–75° C., b. 50–25% wt. refractory which is substantially insoluble in the glass at temperatures of 825°–900° C., both dispersed in a solution of c. an organic polymeric binder in d. volatile nonaqueous organic solvent.

2. A green tape formed by (1) casting onto a flexible substrate a thin layer of a dispersion of finely divided solids comprising:

a. 50–75% wt. noncrystallizable glass of which the deformation temperature ($T_d$) is 580°–625° C. and the softening point ($T_s$) is 630°–700° C. and ($T_s$–$T_d$) is 50°–75° C.

b. 50–25% wt. refractory which is substantially insoluble in the glass at temperatures of 825°–900° C., the refractory and glass solids being selected from the group consisting of $Al_2O_3$, mullite, cordierite, $SiO_2$, $CaZrO_2$, forsterite, $ZrO_2$ and mixtures thereof, both dispersed in a solution of c. an organic polymeric binder in d. volatile nonaqueous organic solvent; (2) heating the cast layer to remove the volatile organic solvent therefrom and (3) separating the solvent-free layer from the substrate.

3. A multilayer interconnection assemblage comprising a plurality of conductively interconnected thick film functional layers separated by layers of the green tape of claim 10, the assemblage having been cofired to volatilize the organic material from the layers and to effect sintering of the solids of the functional layers and densification of the solids of the green tape layers.

* * * * *